United States Patent
Woo et al.

(10) Patent No.: US 11,539,377 B2
(45) Date of Patent: Dec. 27, 2022

(54) DATA TRANSMISSION METHOD AND A DATA TRANSMISSION DEVICE

(71) Applicant: SAMSUNG ELECTRONICS CO., LTD., Suwon-si (KR)

(72) Inventors: Byung-Suk Woo, Hwaseong-si (KR); Chang Kyu Seol, Osan-si (KR); Su Cheol Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/460,857

(22) Filed: Aug. 30, 2021

(65) Prior Publication Data

US 2022/0200622 A1 Jun. 23, 2022

(30) Foreign Application Priority Data

Dec. 17, 2020 (KR) .................. 10-2020-0177122

(51) Int. Cl.
*H03M 5/14* (2006.01)
*G11C 7/10* (2006.01)
*H03M 7/30* (2006.01)
*H03K 19/21* (2006.01)
*H03M 7/14* (2006.01)

(52) U.S. Cl.
CPC .......... *H03M 5/145* (2013.01); *G11C 7/1006* (2013.01); *H03K 19/21* (2013.01); *H03M 7/14* (2013.01); *H03M 7/30* (2013.01)

(58) Field of Classification Search
CPC .......... H03M 5/145; H03M 7/14; H03M 7/30; H03K 19/21; G11C 7/1006; G11C 7/1048
See application file for complete search history.

(56) References Cited

U.S. PATENT DOCUMENTS

| | | | | |
|---|---|---|---|---|
| 5,177,482 A * | 1/1993 | Cideciyan | ........... | H04L 25/4908 341/59 |
| 6,279,116 B1 * | 8/2001 | Lee | ...................... | G11C 11/4076 713/600 |
| 7,221,292 B2 * | 5/2007 | Hein | .................... | G11C 7/1006 341/55 |
| 7,408,483 B2 * | 8/2008 | Lee | ......................... | G11C 7/02 341/55 |

(Continued)

*Primary Examiner* — Lam T Mai
(74) *Attorney, Agent, or Firm* — F. Chau & Associates, LLC

(57) ABSTRACT

A data transmission method for transmitting a data signal using four data signal levels during a unit interval and transmitting a data bus inversion (DBI) signal using two DBI signal levels during the unit interval, the method including: receiving n (n is a natural number) data, each of the n data including a first bit and a second bit; counting the number of data in which the first bit and the second bit have the same value among the n data; in response to the counting result being less than or equal to a predetermined number, transmitting the n data using the four data signal levels, together with a DBI signal having a first DBI signal level; and in response to the counting result being greater than the predetermined number, transmitting data, which is obtained by changing a value of either of the first bit and the second bit of the n data, using the four data signal levels, together with a DBI signal having a second DBI signal level different from the first DBI signal level.

20 Claims, 16 Drawing Sheets

(56) References Cited

U.S. PATENT DOCUMENTS

| | | | | |
|---|---|---|---|---|
| 7,501,963 B1* | 3/2009 | Hollis | H03M 5/145 | 341/55 |
| 7,522,073 B1* | 4/2009 | Kao | H03M 5/145 | 710/110 |
| 7,616,133 B2* | 11/2009 | Hollis | H03M 5/00 | 341/51 |
| 7,869,525 B2* | 1/2011 | Macri | H03L 7/0816 | 710/305 |
| 7,936,289 B2* | 5/2011 | Bae | H03M 5/145 | 341/51 |
| 8,201,071 B2* | 6/2012 | Hein | H03M 5/145 | 714/809 |
| 8,347,047 B2* | 1/2013 | Perego | G06F 13/1684 | 711/170 |
| 8,462,891 B2* | 6/2013 | Kizer | H04L 25/4919 | 375/264 |
| 8,498,344 B2* | 7/2013 | Wilson | H04L 25/49 | 341/51 |
| 8,510,490 B2* | 8/2013 | Abbasfar | G06F 13/4265 | 341/55 |
| 8,854,236 B2 | 10/2014 | Hollis | | |
| 8,909,840 B2* | 12/2014 | Nygren | G06F 13/4273 | 710/305 |
| 10,404,505 B1 | 9/2019 | Wilson | | |
| 10,491,238 B2 | 11/2019 | Sudhakaran et al. | | |
| 10,664,432 B2 | 5/2020 | Ebihara et al. | | |
| 10,747,695 B2 | 8/2020 | Ho et al. | | |
| 2003/0035497 A1* | 2/2003 | Gorecki | H04L 27/08 | 375/317 |
| 2009/0182918 A1* | 7/2009 | Hollis | G11C 7/1006 | 710/106 |
| 2010/0045491 A1* | 2/2010 | Bae | H03M 5/06 | 341/61 |
| 2011/0025533 A1* | 2/2011 | Abbasfar | H04L 25/14 | 341/63 |
| 2011/0128170 A1* | 6/2011 | Bae | H04L 25/03866 | 341/95 |
| 2011/0156934 A1* | 6/2011 | Bae | H04L 25/4908 | 341/58 |
| 2011/0276733 A1* | 11/2011 | Perego | G11C 7/1006 | 710/71 |
| 2011/0316726 A1* | 12/2011 | Hollis | H04L 25/4927 | 341/56 |
| 2012/0056762 A1* | 3/2012 | Hollis | G11C 7/02 | 341/58 |
| 2012/0206280 A1* | 8/2012 | Abbasfar | G06F 13/4204 | 341/51 |
| 2013/0159584 A1* | 6/2013 | Nygren | G06F 13/4273 | 710/305 |
| 2014/0313062 A1* | 10/2014 | Hollis | G11C 7/1006 | 341/58 |
| 2017/0337951 A1* | 11/2017 | Hollis | G11C 7/1006 | |
| 2018/0005671 A1* | 1/2018 | Hollis | G11C 7/22 | |
| 2019/0305765 A1 | 10/2019 | Lee et al. | | |
| 2021/0174849 A1* | 6/2021 | Lee | G11C 7/1009 | |
| 2022/0059156 A1* | 2/2022 | Park | G11C 11/4096 | |
| 2022/0179733 A1* | 6/2022 | Buch | G06F 3/064 | |
| 2022/0214804 A1* | 7/2022 | Park | G06F 3/0679 | |
| 2022/0223220 A1* | 7/2022 | Yoon | G11C 29/42 | |

* cited by examiner

|    | MSB | LSB |
|----|-----|-----|
| D0 | 0   | 0   |
| D1 | 1   | 1   |
| D2 | 0   | 0   |
| D3 | 1   | 1   |
| D4 | 0   | 0   |
| D5 | 1   | 0   |
| D6 | 1   | 0   |
| D7 | 1   | 0   |

FIG. 5

|    | MSB | LSB | XOR |
|----|-----|-----|-----|
| D0 | 0   | 0   | 0   |
| D1 | 1   | 1   | 0   |
| D2 | 0   | 0   | 0   |
| D3 | 1   | 1   | 0   |
| D4 | 0   | 0   | 0   |
| D5 | 1   | 0   | 1   |
| D6 | 1   | 0   | 1   |
| D7 | 1   | 0   | 1   |

FIG. 6

|    | MSB | LSB | XOR | MSB | LSB |         |
|----|-----|-----|-----|-----|-----|---------|
| D0 | 0   | 0   | 0   | 0   | 1   |         |
| D1 | 1   | 1   | 0   | 1   | 0   |         |
| D2 | 0   | 0   | 0   | 0   | 1   |         |
| D3 | 1   | 1   | 0   | 1   | 0   |         |
| D4 | 0   | 0   | 0   | 0   | 1   |         |
| D5 | 1   | 0   | 1   | 1   | 1   |         |
| D6 | 1   | 0   | 1   | 1   | 1   |         |
| D7 | 1   | 0   | 1   | 1   | 1   | DBI = 0 |

FIG. 8

|    | MSB | LSB | XOR | MSB | LSB |
|----|-----|-----|-----|-----|-----|
| D0 | 0   | 0   | 0   | 0   | 0   |
| D1 | 1   | 1   | 0   | 1   | 1   |
| D2 | 0   | 0   | 0   | 0   | 0   |
| D3 | 0   | 1   | 1   | 0   | 1   |
| D4 | 0   | 1   | 1   | 0   | 1   |
| D5 | 1   | 0   | 1   | 1   | 0   |
| D6 | 1   | 0   | 1   | 1   | 0   |
| D7 | 1   | 0   | 1   | 1   | 0   |

DBI = 1

FIG. 11

| MSB | LSB | VOUT | CURRET CONSUMPTION |
|---|---|---|---|
| 1 | 1 | V1 | CC1 |
| 1 | 0 | V2 | CC2 |
| 0 | 1 | V3 | CC3 |
| 0 | 0 | V4 | CC4 |

|  | MSB | LSB |
|---|---|---|
| D0 | 0 | 0 |
| D1 | 0 | 0 |
| D2 | 0 | 0 |
| D3 | 0 | 0 |
| D4 | 0 | 0 |
| D5 | 0 | 1 |
| D6 | 1 | 0 |
| D7 | 1 | 1 |

FIG. 13

|    | MSB | LSB | NOR |
|----|-----|-----|-----|
| D0 | 0   | 0   | 1   |
| D1 | 0   | 0   | 1   |
| D2 | 0   | 0   | 1   |
| D3 | 0   | 0   | 1   |
| D4 | 0   | 0   | 1   |
| D5 | 0   | 1   | 0   |
| D6 | 1   | 0   | 0   |
| D7 | 1   | 1   | 0   |

FIG. 14

|     | MSB | LSB | NOR | MSB | LSB |
|-----|-----|-----|-----|-----|-----|
| D0  | 0   | 0   | 1   | 1   | 1   |
| D1  | 0   | 0   | 1   | 1   | 1   |
| D2  | 0   | 0   | 1   | 1   | 1   |
| D3  | 0   | 0   | 1   | 1   | 1   |
| D4  | 0   | 0   | 1   | 1   | 1   |
| D5  | 0   | 1   | 0   | 1   | 0   |
| D6  | 1   | 0   | 0   | 0   | 1   |
| D7  | 1   | 1   | 0   | 0   | 0   |

DBI = 0

FIG. 15

|    | MSB | LSB | NOR | MSB | LSB |
|----|-----|-----|-----|-----|-----|
| D0 | 0   | 0   | 1   | 0   | 0   |
| D1 | 0   | 0   | 1   | 0   | 0   |
| D2 | 0   | 0   | 1   | 0   | 0   |
| D3 | 1   | 1   | 0   | 1   | 1   |
| D4 | 1   | 1   | 0   | 1   | 1   |
| D5 | 0   | 1   | 0   | 0   | 1   |
| D6 | 1   | 0   | 0   | 1   | 0   |
| D7 | 1   | 1   | 0   | 1   | 1   |

DBI = 1

DATA TRANSMISSION METHOD AND A DATA TRANSMISSION DEVICE

CROSS-REFERENCE TO RELATED APPLICATION

This application claims priority under 35 U.S.C. § 119 to Korean Patent Application No. 10-2020-0177122 filed on Dec. 17, 2020 in the Korean Intellectual Property Office, the disclosure of which is incorporated by reference herein in its entirety.

1. TECHNICAL FIELD

The present disclosure relates to a data transmission method and a data transmission device.

2. DESCRIPTION OF THE RELATED ART

Data bits may be transferred between two electronic devices through a data bus. However, data bits traveling through the data bus may be sensitive to crosstalk, simultaneous switching noise (SSN), inter-symbol interference (ISI), or the like depending on the state of the data or the frequency of the data transition. To reduce these adverse effects, a data encoding method such as data bus inversion (DBI) may be used. In DBI, the data to be transmitted may or may not be inverted prior to transmission in accordance with a predetermined encoding algorithm.

Multi-level signaling techniques such as pulse-amplitude modulation 4 (PAM4) and PAM8 that transmit data using a plurality of signal levels through a data bus may have reduced signal integrity (SI) and power consumption characteristics compared to, for example, single level signaling techniques such as non-return-to-zero (NRZ).

Accordingly, in a multi-level signaling environment, research is underway to improve signal transmission characteristics using DBI.

SUMMARY

According to an embodiment of the present disclosure, there is provided a data transmission method for transmitting a data signal using four data signal levels during a unit interval and transmitting a data bus inversion (DBI) signal using two DBI signal levels during the unit interval, the method including: receiving n (n is a natural number) data, each of the n data including a first bit and a second bit; counting the number of data in which the first bit and the second bit have the same value among the n data; in response to the counting result being less than or equal to a predetermined number, transmitting the n data using the four data signal levels, together with a DBI signal having a first DBI signal level; and in response to the counting result being greater than the predetermined number, transmitting data, which is obtained by changing a value of either of the first bit and the second bit of the n data, using the four data signal levels, together with a DBI signal having a second DBI signal level different from the first DBI signal level.

According to an embodiment of the present disclosure, there is provided a data transmission device including: a logic operator configured to perform a logic operation on n (n is a natural number) first bits and n second bits to output n logic operation results; a DBI determiner configured to generate a DBI determination signal by counting the n logic operation results; an inversion unit configured to generate n inversion bits by inverting values of the n second bits based on the DBI determination signal; a data transmission unit configured to receive the n inversion bits and the n first bits and transmit the received n inversion bits and n first bits as a data signal; and a DBI transmitter configured to generate and transmit a DBI signal based on the DBI determination signal, wherein the n inversion bits include a first inversion bit, the n first bits include a third bit, the n first bits and the n second bits include first data, the data transmission unit transmits the data signal by selecting one of four data signal levels based on the first inversion bit and the third bit, and the DBI transmitter transmits the DBI signal by selecting one of two DBI signal levels based on the DBI determination signal.

According to an embodiment of the present disclosure, there is provided a data transmission method for transmitting a data signal using four data signal levels during a unit interval and transmitting a DBI signal using two DBI signal levels during the unit interval, the method including: receiving n (n is a natural number) data, each of the n data including a first bit and a second bit; counting the number of data in which the first bit and the second bit have a predetermined value among the n data; in response to the counting result being less than or equal to a predetermined number, transmitting the n data using the four data signal levels, together with a DBI signal having a first DBI signal level; and in response to the counting result being greater than the predetermined number, transmitting data, which is obtained by changing values of the first bit and the second bit of the n data, using the four data signal levels, together with a DBI signal having a second DBI signal level different from the first DBI signal level.

BRIEF DESCRIPTION OF THE DRAWINGS

The above and other features of the present disclosure will become more apparent by describing in detail embodiments thereof with reference to the attached drawings, in which:

FIGS. 4, 5, 6, 7 and 8 are diagrams illustrating a data transmission method according to some embodiments of the present disclosure;

FIGS. 10, 11, 12, 13, 14 and 15 are diagrams illustrating a data transmission method according to some embodiments of the present disclosure.

DETAILED DESCRIPTION OF THE EMBODIMENTS

Hereinafter, embodiments of the present disclosure will be described with reference to the accompanying drawings.

Figure 1:
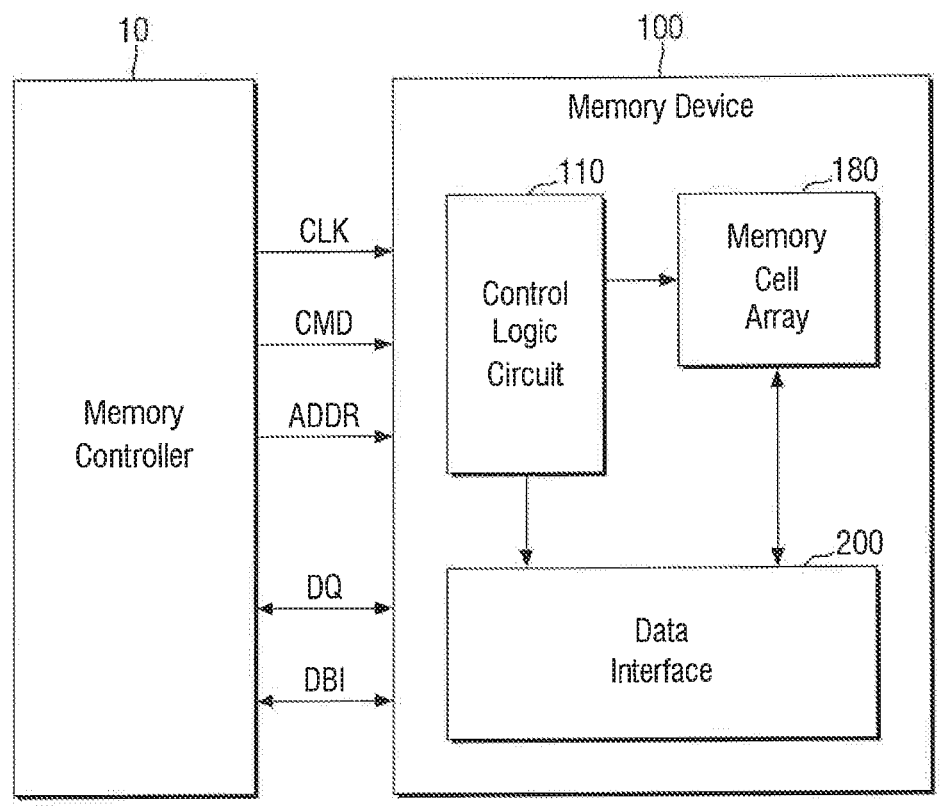
FIG. 1 is a block diagram of a memory system according to some embodiments of the present disclosure.

FIG. 1 is a block diagram of a memory system according to some embodiments of the present disclosure.

Referring to FIG. 1, a memory system 1 may include a memory controller 10, and a memory device 100.

The memory controller 10 may overall control the operation of the memory system 1. For example, the memory controller 10 may control data exchange between an external host and the memory device 100. For example, the memory controller 10 may control the memory device 100 according to a request from a host, and may thereby write data or read data. For example, the memory controller 10 may receive a read request or a write request from the host.

The memory controller 10 may control the operation of the memory device 100 by applying a command CMD for controlling the memory device 100. Here, the memory device 100 may include dynamic memory cells. For example, the memory device 100 may include dynamic random access memory (DRAM), double data rate 4 (DDR4) synchronous DRAM (SDRAM), low power DDR4 (LPDDR4) SDRAM, LPDDR5 SDRAM, or the like. However, embodiments of the present disclosure are not limited thereto, and the memory device 100 may include a non-volatile memory device. For example, the memory device 100 may include a flash memory device.

The memory controller 10 may transmit a clock signal CLK, the command CMD, an address ADDR, or the like to the memory device 100. The memory controller 10 may provide a data signal DQ to the memory device 100 and may receive the data signal DQ from the memory device 100. The memory device 100 may include a memory cell array 180 in which data of the data signal DQ is stored, a control logic circuit 110, a data interface 200, and the like.

The data interface 200 may receive the data signal DQ and provide data of the data signal DQ to the memory cell array 180. In other words, prior to being input to the memory cell array 180, input data passes through the data interface 200. In addition, the data interface 200 may provide the data signal DQ having data read from the memory cell array 180 to the memory controller 10. In other words, data to be output from the memory device 100 passes through the data interface 200.

The data interface 200 may receive a data bus inversion (DBI) signal DBI and decode the data signal DQ provided from the memory controller 10 based on the DBI signal DBI. In other words, the data interface 200 may decode the data signal DQ in response to the DBI signal. In addition, the data interface 200 may provide the memory controller 10 with the DBI signal DBI capable of decoding the data signal DQ that includes data read from the memory cell array 180.

In some embodiments of the present disclosure, the data signal DQ, for example, may be transmitted through a multi-level signaling scheme such as pulse-amplitude modulation 4 (PAM4) and PAM5. In addition, the DBI signal DBI, for example, may be transmitted through a single level signaling scheme such as non-return-to-zero (NRZ).

The control logic circuit 110 may control access to the memory cell array 180 based on the command CMD and the address ADDR, and may control an operation of the data interface 200.

Figure 2:
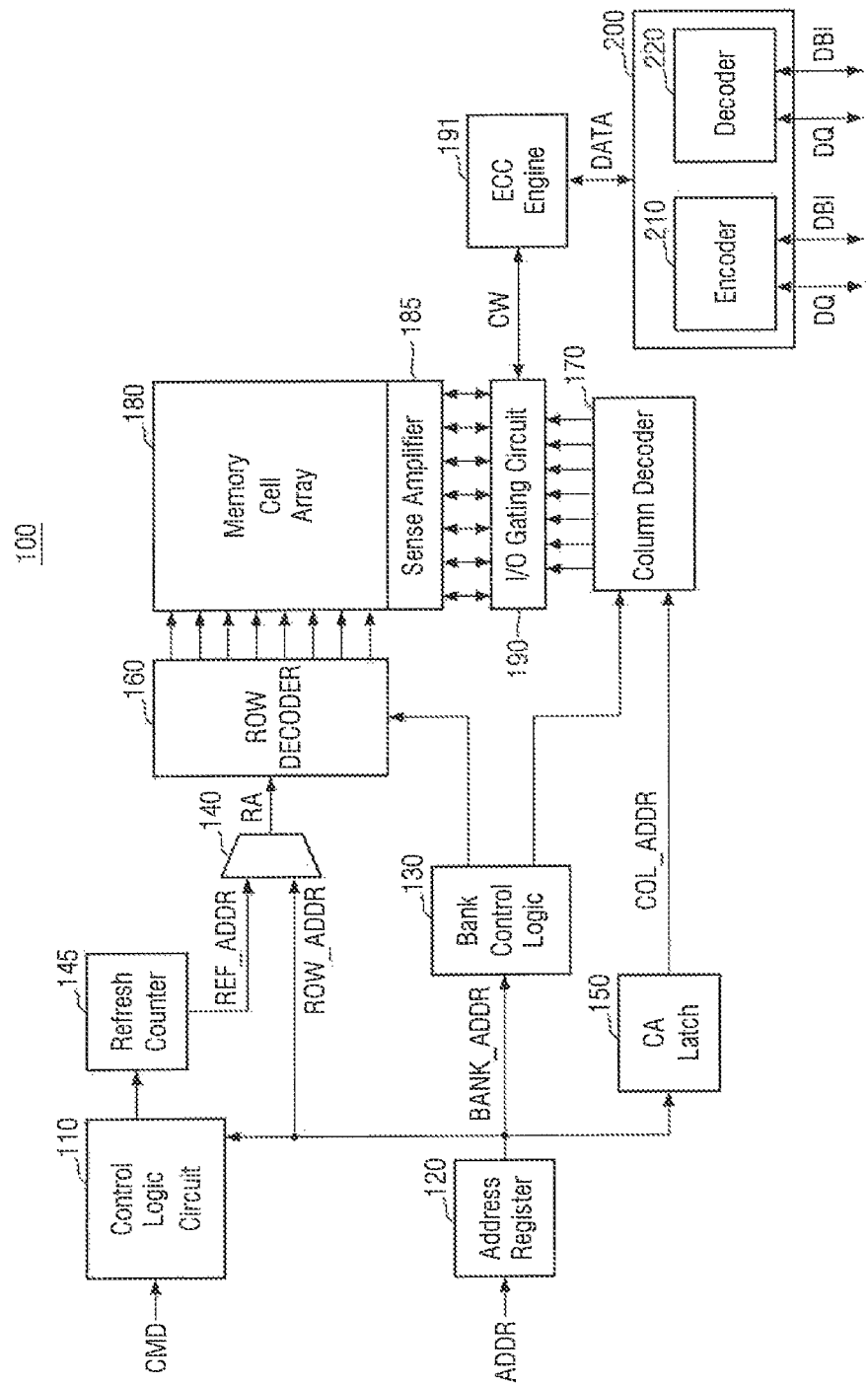
FIG. 2 is a block diagram of a memory device according to some embodiments of the present disclosure.

FIG. 2 is a block diagram of a memory device according to some embodiments of the present disclosure.

Referring to FIG. 2, the memory device 100 may include the control logic circuit 110, an address register 120, a bank control logic circuit 130, a row address multiplexer 140, a refresh counter 145, a column address latch 150, a row decoder 160, a column decoder 170, the memory cell array 180, a sense amplifier 185, an input/output gating circuit 190, an error correction code (ECC) engine 191, the data interface 200, and the like.

The memory cell array 180 may include a plurality of bank arrays. The row decoder 160 may be connected to the plurality of bank arrays. For example, the row decoder 160 may be connected to word lines of the plurality of bank arrays. In addition, a plurality of row decoders 160 may be provided to correspond to respective ones of the bank arrays. The column decoder 170 may be connected to the plurality of bank arrays. A plurality of column decoders 170 may be provided to correspond to respective ones of the bank arrays. The sense amplifier 185 may be connected to each of the plurality of bank arrays. For example, the sense amplifier 185 may be connected to bit lines of the plurality of bank arrays. In addition, a plurality of sense amplifiers 185 may be provided to correspond to respective ones of the bank arrays. The memory cell array 180 may include a plurality of word lines, a plurality of bit lines, and a plurality of memory cells formed at a point where the word line and the bit line cross each other.

The address register 120 may receive the address ADDR from a memory controller (10 of FIG. 1). The address ADDR may include a bank address BANK_ADDR, a row address ROW_ADDR, a column address COL_ADDR, and the like. The address register 120 may provide the bank address BANK_ADDR to the bank control logic circuit 130. The address register 120 may provide the row address ROW_ADDR to the row address multiplexer 140. The address register 120 may provide the column address COL_ADDR to the column address latch 150.

The bank control logic circuit 130 may generate a bank control signal in response to the bank address BANK_ADDR. The row decoder 160 may be activated in response to a bank control signal. In addition, the column decoder 170 may be activated in response to a bank control signal corresponding to the bank address BANK_ADDR.

The row address multiplexer 140 may receive a row address ROW_ADDR from the address register 120 and may receive a refresh row address REF_ADDR from the refresh counter 145. The row address multiplexer 140 may select one of the row address ROW_ADDR or the refresh row address REF_ADDR and output the selection as a row address RA. The row address RA may be transmitted to the row decoder 160.

The refresh counter 145 may sequentially output the refresh row address REF_ADDR under the control of the control logic circuit 110.

The row decoder 160 activated by the bank control logic circuit 130 may activate a word line corresponding to the row address RA by decoding the row address RA outputted from the row address multiplexer 140. For example, the row decoder 160 may apply a word line driving voltage to a word line corresponding to the row address RA.

The column address latch 150 may receive the column address COL_ADDR from the address register 120 and temporarily store the received column address COL_ADDR. The column address latch 150 may gradually increase the column address COL_ADDR received in the burst mode. The column address latch 150 may provide a temporarily stored column address COL_ADDR or the gradually increased column address COL_ADDR to the column decoder 170.

Among the plurality of column decoders 170, the column decoder 170 activated by the bank control logic circuit 130 may activate the sense amplifier 185 corresponding to the bank address BANK_ADDR and the column address COL_ADDR through the corresponding input/output gating circuit 190.

The input/output gating circuit 190 may include a circuit for gating input/output data, an input data mask logic, read data latches for storing data outputted from the memory cell array 180, and write drivers for writing data to the memory cell array 180.

A codeword CW read from the bank array of the memory cell array 180 may be sensed by the sense amplifier 185 corresponding to the bank array. In addition, the codeword CW may be stored in the read data latch. The codeword CW stored in the read data latch may be ECC-decoded by the ECC engine 191, and the data signal DQ on which ECC decoding has been performed may be provided to the memory controller 10 through the data interface 200.

The data interface 200 may include an encoder 210 and a decoder 220.

The encoder 210 may receive and encode data DATA to generate the data signal DQ and the DBI signal DBI. The data signal DQ and the DBI signal DBI generated from the encoder 210 may be provided to a memory controller (10 of FIG. 1). A memory controller (10 of FIG. 1) may restore the data DATA by decoding the data signal DQ using the received DBI signal DBI.

The decoder 220 may receive the data signal DQ and the DBI signal DBI from a memory controller (10 in FIG. 1), and decode the data signal DQ with the DBI signal DBI to generate the data DATA.

Figure 3:
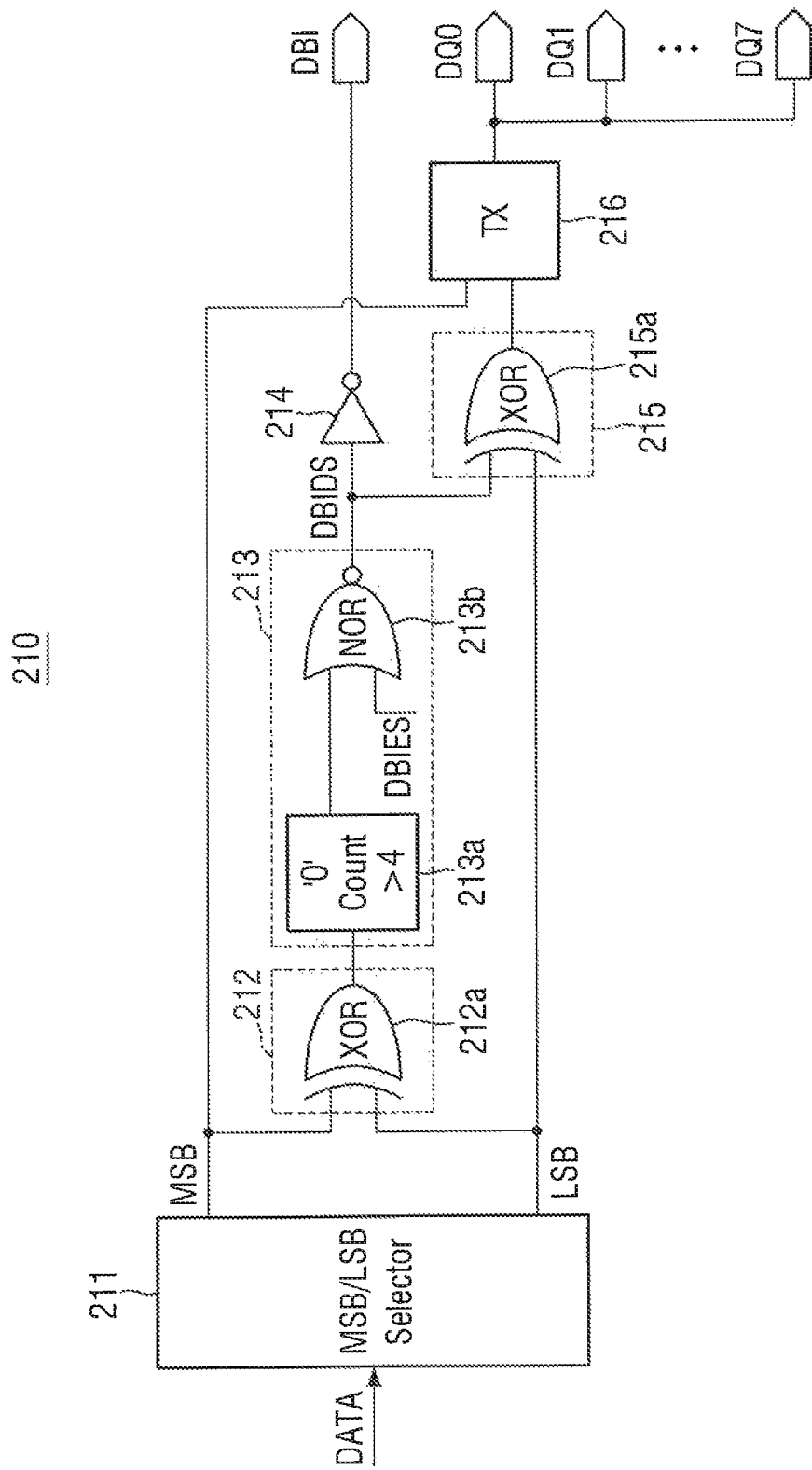
FIG. 3 is a block diagram of an encoder of FIG. 2.

FIG. 3 is a block diagram of the encoder of FIG. 2. FIGS. 4 to 8 are diagrams illustrating a data transmission method according to some embodiments of the present disclosure.

Hereinafter, the encoder 210 according to an embodiment of the present disclosure will be described with reference to an example where the encoder 210 outputs the data signal DQ through eight DQ ports DQ0 to DQ7 and outputs the DBI signal DBI through one DBI port, but the present disclosure is not limited thereto.

In addition, hereinafter, the encoder 210 will be described with reference to an example where during a unit interval (UI of FIG. 7), the data signal DQ is transmitted (e.g., signal transmission using PAM4) using four data signal levels (DSL1 to DSL4 of FIG. 7), and the DBI signal DBI is transmitted (e.g., signal transmission using NRZ) using two DBI signal levels (BSL1 and BSL2 in FIG. 7), but the present disclosure is not limited thereto.

Hereinafter, a data signal level (DSL1 in FIG. 7) may correspond to data 00, a data signal level (DSL2 in FIG. 7) may correspond to data 01, a data signal level (DSL3 in FIG. 7) may correspond to data 10, and a data signal level (DSL4 in FIG. 7) may correspond to data 11. In addition, a DBI signal level (BSL1 of FIG. 7) may correspond to data 0, and a DBI signal level (BSL2 of FIG. 7) may correspond to data 1. However, the present disclosure is not limited thereto, and the correspondence between the signal level and the data may be varied.

The encoder 210 illustrated in FIG. 3 may improve signal integrity (SI) of signal transmission when the data signal DQ is provided to the memory controller 10. The encoder 210 is described as follows.

To improve signal integrity in a data transmission channel, the occurrence of a maximum transition in transmitted data should be prevented. For example, when 00 is transmitted as the data signal DQ in a first unit interval UI and 11 is transmitted as the data signal DQ in a subsequent second unit interval UI, a maximum transition occurs. In addition, when 11 is transmitted as the data signal DQ in the first unit interval UI and 00 is transmitted as the data signal DQ in the subsequent second unit interval UI, a maximum transition also occurs. Since the frequent occurrence of the maximum transition degrades the signal integrity (SI) of the data transmission channel, to the occurrence of the maximum transmission should be minimized.

Accordingly, in the present embodiment, when the number of data that may cause the maximum transition among data to be transmitted in the unit interval UI is large, the signal integrity (SI) of the data channel may be improved by inverting and transmitting the data through DBI.

As described above, the data that may cause the maximum transition is the case where the most significant bit (MSB) and the least significant bit (LSB) constituting the data signal DQ are the same, either 11 or 00. Accordingly, in the present embodiment, when the number of data having the same MSB and LSB values among n data to be transmitted in the unit interval UI (where n may be the same as the number of DQ ports) is counted and the number of data having the same MSB and LSB values exceeds a predetermined number (e.g., n/2), the data is inverted and transmitted using DBI.

In this case, data inversion may be performed on either of the MSB and the LSB of data having the same MSB and LSB values. When either of the two is inverted, it may be guaranteed that the number of data of which the value of MSB and the value of LSB are different exceeds a predetermined number (e.g., n/2). In other words due to the data inversion, the number of data having the different MSB and LSB values exceeds the predetermined number.

Accordingly, it is possible to improve signal integrity of the data channel by preventing a maximum transition that may occur in the data channel in advance.

Referring to FIG. 3, the encoder 210 may include a bit separator 211 (e.g., MSB/LSB selector), a logic calculator 212, a DBI determiner 213, an inverter 214, an inversion unit 215, and a data transmission unit 216.

Figure 7:
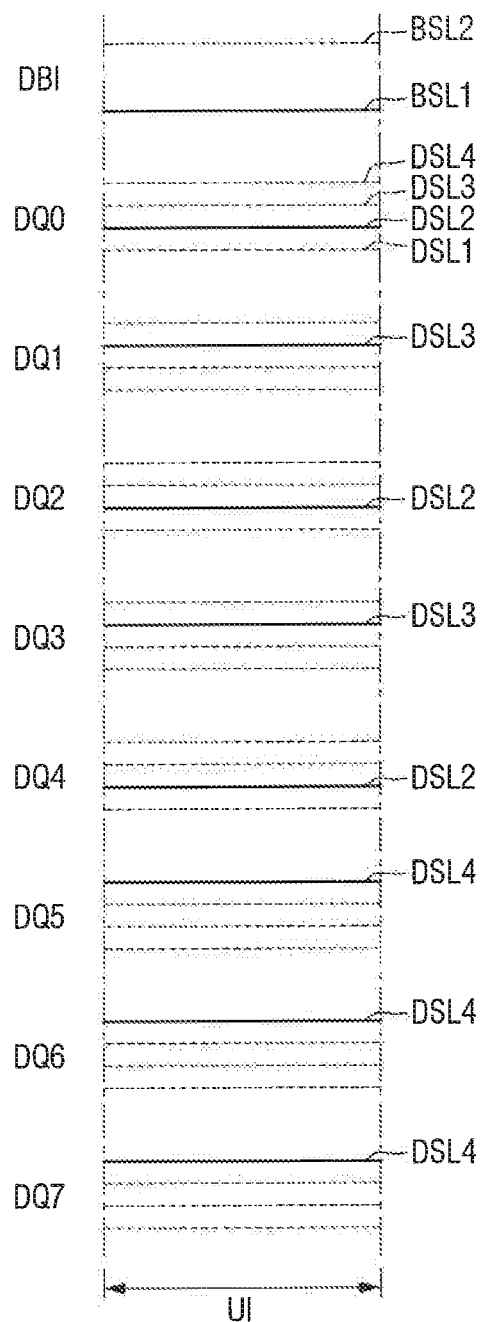

When the number of DQ ports DQ0 to DQ7 is eight, and the data signal DQ transmitted from each of the DQ ports DQ0 to DQ7 is outputted at four data signal levels DSL1 to DSL4 as illustrated in FIG. 7, 16 bits corresponding to the unit interval UI may be provided to the bit separator 211. These 16 bits may be provided from, for example, a memory cell array (180 in FIG. 2), but the present disclosure is not limited thereto.

The 16 bits may be separated into the MSB and the LSB by the bit separator 211. Each of the MSB and LSB pairs may constitute one piece of data. In other words, each data outputted during the unit interval UI through the DQ ports DQ0 to DQ7 may include an MSB and LSB pair. In this case, the bit value of the MSB and the bit value of the LSB may determine the data signal levels DSL1 to DSL4 of data outputted through each of the DQ ports DQ0 to DQ7.

For example, referring to FIG. 4, the bit separator 211 may receive the illustrated 16 bits and separate the MSB and LSB of each data. For example, in data D0, the MSB is 0 and the LSB is 0, in data D1, the MSB is 1 and the LSB is 1, in data D2, the MSB is 0 and the LSB is 0, and in data D3, the MSB is 1 and the LSB is 1. In data D4, the MSB is 0 and the LSB is 0, in data D5, the MSB is 1 and the LSB is 0, in data D6, the MSB is 1 and the LSB is 0, and in data D7, the MSB is 1 and the LSB is 0.

Here, the data D0 to D7 are data to be outputted through each of the DQ ports DQ0 to DQ7 during a unit interval (UI of FIG. 7).

Referring to FIG. 3, the logic operator 212 may perform a logic operation on eight MSBs and eight LSBs to output eight logic operation results. In the present embodiment, the logic operator 212 may include an XOR gate 212a that performs an XOR operation.

FIG. 5 is a diagram illustrating a result of performing an XOR operation on eight MSBs and eight LSBs illustrated in FIG. 4. Referring to FIG. 5, by the XOR operation, the operation result is 0 for data of which the value of MSB and the value of LSB are the same, and the operation result is 1 for data of which the value of MSB and the value of LSB are different. For example, in FIG. 5, there are five occurrences where the value of the MSB and the value of the LSB are the same and there are three occurrences where the value of the MSB and the value of the LSB are different.

Referring to FIG. 3, the DBI determiner 213 may generate a DBI determination signal DBIDS by counting eight logic operation results.

In the present embodiment, the DBI determiner 213 may include a counter 213a and a NOR gate 213b.

The counter 213a may count the number of 0s among eight XOR results. When the number of 0s is four or less, the counter 213a may output 1, and when the number of 0s is more than 4, the counter 213a may output 0.

In the example illustrated in FIG. 5, since the number of 0s is five, the counter 213a may output 0. In the case where the number five exceeds the predetermined threshold of four, if the data D0 to D7 are transmitted without DBI, there is a possibility that a maximum transition may occur, so that DBI is required.

The NOR gate 213b may receive a DBI enable signal DBIES and an output of the counter 213a and perform a NOR operation. In some embodiments of the present disclosure, when the DBI enable signal DBIES is 0, it may be a DBI enable mode, and when the DBI enable signal DBIES is 1, it may be a DBI disable mode.

In the DBI disable mode, the NOR gate 213b outputs 0 regardless of the output of the counter 213a. In other words, the value of the DBI determination signal DBIDS does not change according to the output of the counter 213a. Accordingly, DBI does not work.

In the DBI enable mode, the NOR gate 213b outputs different values according to the output of the counter 213a. When the output of the counter 213a is 0, the value of the DBI determination signal DBIDS is 1. Conversely, when the output of the counter 213a is 1, the value of the DBI determination signal DBIDS is 0.

In the example illustrated in FIG. 5, since the output of the counter 213a is 0, the value of the DBI determination signal DBIDS is 1. In this case, it is necessary to perform DBI. Conversely, when the value of the DBI determination signal DBIDS is 0, DBI is not required.

The inverter 214 may function as a DBI transmitter. In other words, the inverter 214 may generate and transmit the DBI signal DBI based on the DBI determination signal DBIDS.

In the example illustrated in FIG. 5, since the value of the DBI determination signal DBIDS is 1, the inverter 214 outputs the DBI signal DBI having a value of 0. Accordingly, the DBI signal DBI has a DBI signal level BSL1 as illustrated in FIG. 7.

Referring to FIG. 3, the inversion unit 215 may generate eight inversion bits by inverting the values of eight LSBs based on the DBI determination signal DBIDS. In the present embodiment, the inversion unit 215 may include the XOR gate 215a that receives the DBI determination signal DBIDS and eight LSBs and performs an XOR operation to generate eight inversion bits.

Referring to FIG. 6, the XOR gate 215a may invert the LSB value of the data D0 to change the data D0 from 00 to 01, invert the LSB value of the data D1 to change the data D1 from 11 to 10, invert the LSB value of the data D2 to change the data D2 from 00 to 01, and invert the LSB value of the data D3 to change the data D3 from 11 to 10. In addition, the XOR gate 215a may invert the LSB value of the data D4 to change the data D4 from 00 to 01, invert the LSB value of the data D5 to change the data D5 from 10 to 11, invert the LSB value of the data D6 to change the data D6 from 10 to 11, and invert the LSB value of the data D7 to change the data D7 from 10 to 11.

Since the DBI signal DBI having a value of 0 is transmitted together through the DBI port, the receiving device (e.g., the memory controller 10 of FIG. 1) may invert the LSB of the received data signal DQ to restore data.

Although, in FIG. 3, the inversion unit 215 for changing the LSB value is illustrated, but the present embodiment is not limited thereto. In some other embodiments of the present disclosure, the encoder 210 may include an inversion unit that changes the MSB value rather than the LSB value. For example, the MSB value may be provided to the input of the XOR gate 215a and the LSB value may be provided to the input of the data transmission unit 216.

Referring to FIGS. 3 and 7, the data transmission unit 216 may determine the data signal levels DSL1 to DSL4 of each data D0 to D7 based on the values of MSB and LSB of each data D0 to D7, and may transmit each data D0 to D7 as the data signal DQ.

In the example illustrated in FIG. 6, since the data D0 is 01, it may be transmitted with the data signal level DSL2 through the DQ port DQ0, since the data D1 is 10, it may be transmitted with the data signal level DSL3 through the DQ port DQ1, since the data D2 is 01, it may be transmitted with the data signal level DSL2 through the DQ port DQ2, and since the data D3 is 10, it may be transmitted with the data signal level DSL3 through the DQ port DQ3. Since the data D4 is 01, it may be transmitted with the data signal level DSL2 through the DQ port DQ4, since the data D5 is 11, it may be transmitted with the data signal level DSL4 through the DQ port DQ5, since the data D6 is 11, it may be transmitted with the data signal level DSL4 through the DQ port DQ6, and since the data D7 is 11, it may be transmitted with the data signal level DSL4 through the DQ port DQ7.

As can be seen in FIGS. 6 and 7, before DBI is performed, the number of data of which the value of MSB and the value of LSB are the same among the eight data D0 to D7 to be transmitted in the unit interval UI has been five, but it can be seen that it is reduced to three through performing DBI. For example, each of the MSB and LSB of the data D0 to D4 is different and each of the MSB and LSB of data D5 to D7 is the same. Therefore, the number of the data has been reduced from five to three. Accordingly, the probability of the occurrence of a maximum transition in the data channel is reduced, and signal integrity of the data channel may be improved.

FIG. 8 is a diagram illustrating a case where data different from the data illustrated in FIG. 4 is provided to an encoder.

Referring to FIGS. 3 and 8, the bit separator 211 may receive the illustrated 16 bits and separate the MSB and LSB of each data. For example, in data D0, the MSB is 0 and the LSB is 0, in data D1, the MSB is 1 and the LSB is 1, in data D2, the MSB is 0 and the LSB is 0, and in data D3, the MSB is 0 and the LSB is 1. In data D4, the MSB is 0 and the LSB is 0, in data D5, the MSB is 1 and the LSB is 0, in data D6, the MSB is 1 and the LSB is 0, and in data D7, the MSB is 1 and the LSB is 0.

When an XOR operation is performed on eight MSBs and eight LSBs illustrated, the operation result is 0 for data of which the value of MSB and the value of LSB are the same, and the operation result is 1 for data of which the value of MSB and the value of LSB are different.

In the example illustrated in FIG. 8, since the number of 0s is three, the counter 213a may output 1. In this case, the data D0 to D7 may be transmitted without DBI.

In the example illustrated in FIG. 8, since the output of the counter 213a is 1, the value of the DBI determination signal DBIDS is 0. In this case, there is no need to perform DBI.

In the example illustrated in FIG. 8, since the value of the DBI determination signal DBIDS is 0, the inverter 214 outputs the DBI signal DBI having a value of 1. In this case, the receiving device (for example, the memory controller 10 of FIG. 1) does not perform a separate DBI restoration operation on the data signal DQ.

In addition, since the value of the DBI determination signal DBIDS is 0, the XOR gate 215a does not generate an inversion bit for LSB. Accordingly, the data D0 to D7 may be provided to the data transmission unit 216 without changing the value of MSB or LSB, and the data transmission unit 216 may determine the data signal levels DSL1 to DSL4 of each data D0 to D7 based on the values of MSB and LSB of each data D0 to D7 and may transmit each data D0 to D7 as the data signal DQ.

Figure 9:
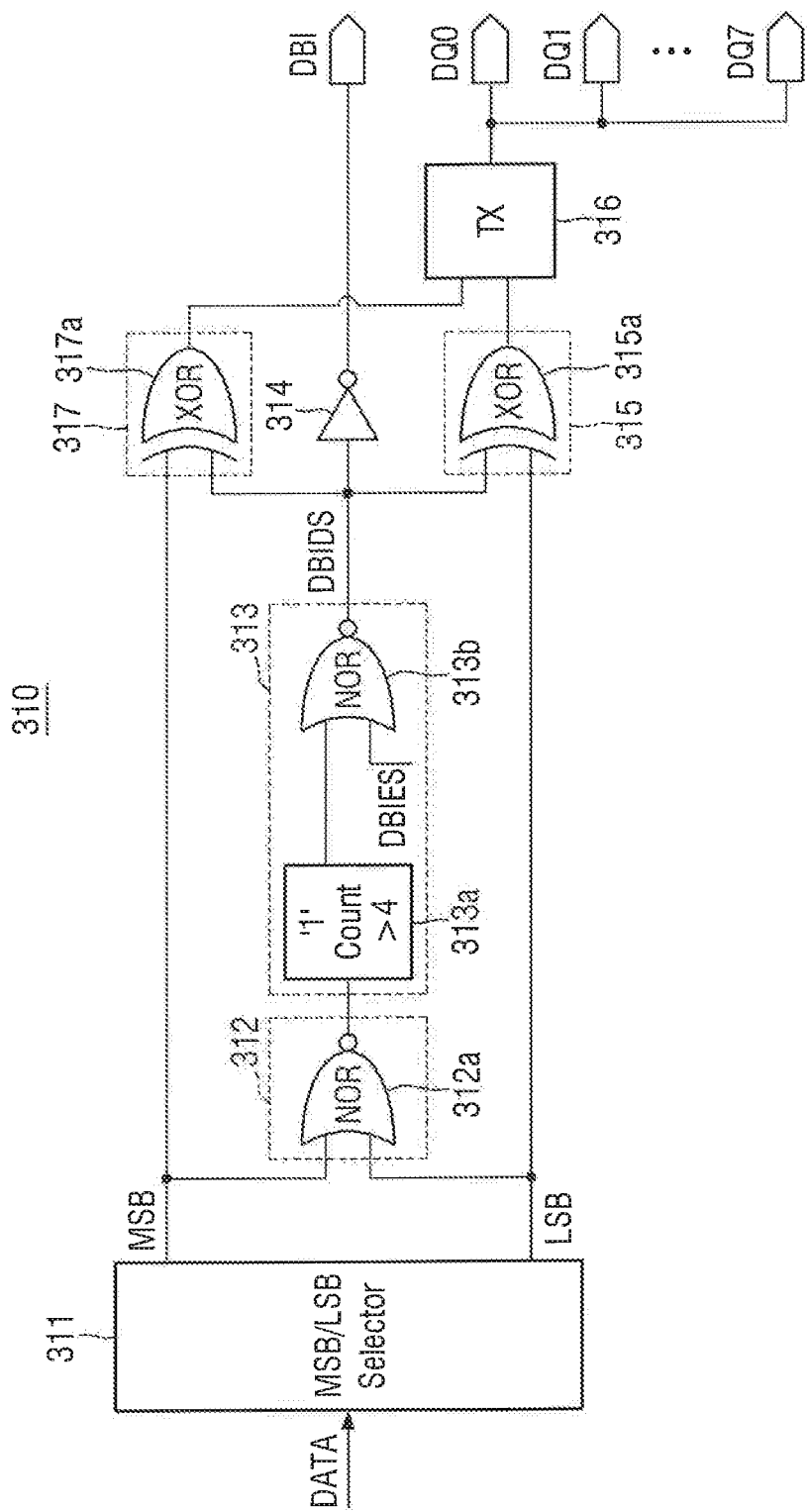
FIG. 9 is a block diagram of an encoder according to some embodiments of the present disclosure.

FIG. 9 is a block diagram of an encoder according to some embodiments of the present disclosure. FIGS. 10 to 15 are diagrams illustrating a data transmission method according to some embodiments of the present disclosure.

When providing the data signal DQ to the memory controller 10, an encoder 310 illustrated in FIG. 9 may reduce power consumption in a signal transmission process. The encoder 310 is described as follows.

Figure 10:
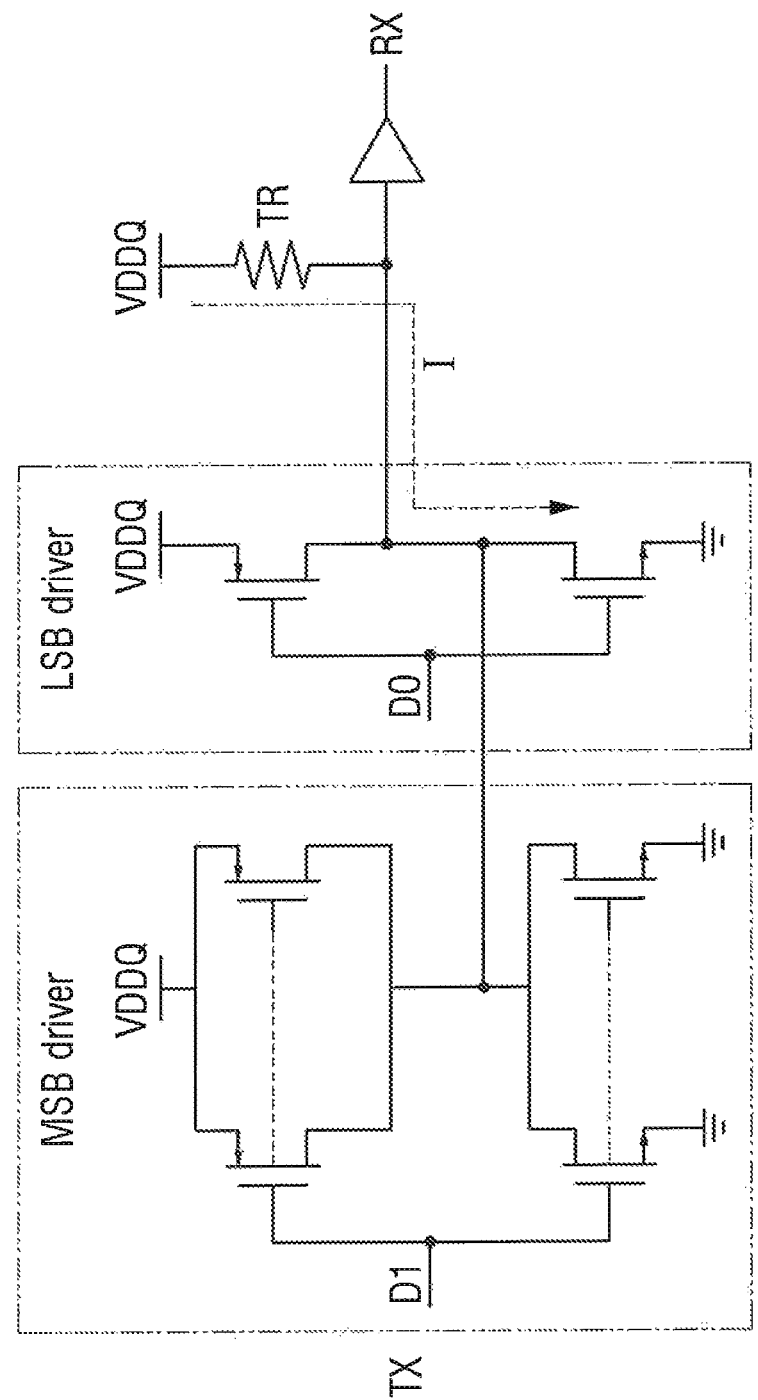

When the data channel is represented by the equivalent circuit illustrated in FIG. 10, the amount of current consumed to transmit each data varies as illustrated in FIG. 11 due to a termination resistor TR.

For example, referring to FIGS. 10 and 11, the current of CC1 may be consumed to transmit the data 11 from a transmitter TX to a receiver RX, the current of CC2 may be consumed to transmit the data 10 from the transmitter TX to the receiver RX, the current of CC3 may be consumed to transmit the data 01 from the transmitter TX to the receiver RX, and the current of CC4 may be consumed to transmit the data 00 from the transmitter TX to the receiver RX.

Here, the size of the CC4 is the largest because a current path I as illustrated in FIG. 10 is formed to transmit the data 00 from the transmitter TX to the receiver RX and the consumption current increases. When the position of the termination resistor TR is changed differently from that shown in FIG. 10, the amount of current consumed to transmit the data 11 from the transmitter TX to the receiver RX may be even larger. In FIG. 10, the transmitter TX includes an MSB driver and an LSB driver. The MSB driver includes several transistors connected between power VDDQ and ground, the transistors being activated by data D1, for example. The LSB driver includes a pair of transistors connected between power VDDQ and ground, the transistors being activated by data D0, for example.

Accordingly, in the present embodiment, of data to be transmitted in the unit interval UI, when the number of data that is expected to increase the current to be consumed is large, the data is inverted through DBI and transmitted. In this case, it is possible to reduce the amount of current to be consumed in the signal transmission process of the data channel.

As described above, the data that consumes a lot of current in data transmission is a case where the MSB and LSB constituting the data signal DQ are 00 or 11. In other words, the data that consumes a lot of current occurs when the MSB and LSB of the data are the same. Accordingly, in the present embodiment, when the number of data having the MSB and LSB values of 00 among n data to be transmitted in the unit interval UI (here, n may be the same as the number of DQ ports) is counted and the number of data having the same MSB and LSB values exceeds a predetermined number (e.g., n/2), the data is inverted and transmitted using DBI. However, the present disclosure is not limited thereto, and the embodiment to be described below may be modified and implemented by counting the number of data having the MSB and LSB values of 11 to determine the DBI operation.

Referring to FIG. 9, the encoder 310 may include a bit separator 311, a logic calculator 312, a DBI determiner 313, an inverter 314, inversion units 315 and 317, and a data transmission unit 316. The inversion units 315 and 317 may be referred to as first and second inversion units, respectively.

16 bits corresponding to the unit interval UI may be provided to the bit separator 311. These 16 bits may be provided from, for example, a memory cell array (180 in FIG. 2), but embodiments of the present disclosure are not limited thereto.

The 16 bits may be separated into the MSB and the LSB by the bit separator 311. Each of the MSB and LSB pairs may constitute one piece of data. In other words, each data outputted during the unit interval UI of FIG. 7 through the DQ ports DQ0 to DQ7 may include an MSB and LSB pair. For example, data output through DQ port DQ0 may include a first MSB and LSB pair and data output through DQ port DQ1 may include a second MSB and LSB pair. In this case, the bit value of the MSB and the bit value of the LSB may determine the data signal levels DSL1 to DSL4 of data outputted through each of the DQ ports DQ0 to DQ7.

For example, referring to FIG. 12, the bit separator 311 may receive the illustrated 16 bits and separate the MSB and LSB of each data. For example, in the data D0, the MSB is 0 and the LSB is 0, in the data D1, the MSB is 0 and the LSB is 0, in the data D2, the MSB is 0 and the LSB is 0, and in the data D3, the MSB is 0 and the LSB is 0. In the data D4, the MSB is 0 and the LSB is 0, in the data D5, the MSB is 0 and the LSB is 1, in the data D6, the MSB is 1 and the LSB is 0, and in the data D7, the MSB is 1 and the LSB is 1.

Here, the data D0 to D7 are data to be outputted through each of the DQ ports DQ0 to DQ7 during a unit interval (UI of FIG. 7).

Referring to FIG. 9, the logic calculator 312 may perform a logic operation on eight MSBs and eight LSBs to output eight logic operation results. In the present embodiment, the logic operator 312 may include a NOR gate 312a that performs a NOR operation.

FIG. 13 is a diagram illustrating a result of performing a NOR operation on eight MSBs and eight LSBs illustrated in FIG. 12. Referring to FIG. 13, by the NOR operation, the operation result is 1 for data of which the value of MSB and the value of LSB are 00, and the operation result is 0 for other data.

Referring to FIG. 9, the DBI determiner 313 may generate the DBI determination signal DBIDS by counting eight logic operation results.

In the present embodiment, the DBI determiner 313 may include a counter 313a and a NOR gate 313b.

The counter 313a may count the number of 1s out of eight NOR results. When the number of 1s is four or less, the counter 313a may output 1, and when the number of 1s is more than 4, the counter 313a may output 0.

In the example illustrated in FIG. 13, since the number of 1s is five, the counter 313a may output 0. In this case, if the data D0 to D7 are transmitted without DBI, the current consumption may increase, so that DBI is required.

The NOR gate 313b may receive the DBI enable signal DBIES and an output of the counter 313a and perform a NOR operation. In some embodiments of the present disclosure, when the DBI enable signal DBIES is 0, it may be a DBI enable mode, and when the DBI enable signal DBIES is 1, it may be a DBI disable mode.

In the DBI disable mode, the NOR gate 313b outputs 0 regardless of the output of the counter 313a. In other words, the value of the DBI determination signal DBIDS does not change according to the output of the counter 313a. Accordingly, DBI does not work.

In the DBI enable mode, the NOR gate 313b outputs different values according to the output of the counter 313a. When the output of the counter 313a is 0, the value of the DBI determination signal DBIDS is 1. Conversely, when the output of the counter 313a is 1, the value of the DBI determination signal DBIDS is 0.

In the example illustrated in FIG. 13, since the output of the counter 313a is 0, the value of the DBI determination signal DBIDS is 1. In this case, it is necessary to perform DBI. Conversely, when the value of the DBI determination signal DBIDS is 0, DBI is not required.

The inverter 314 may function as a DBI transmitter. In other words, the inverter 314 may generate and transmit the DBI signal DBI based on the DBI determination signal DBIDS.

In the example illustrated in FIG. 13, since the value of the DBI determination signal DBIDS is 1, the inverter 314 outputs the DBI signal DBI having a value of 0.

Referring to FIG. 9, the inversion units 315 and 317 may invert the values of eight MSBs and the values of eight LSBs based on the DBI determination signal DBIDS. In the present embodiment, the inversion units 315 and 317 may include an XOR gate 315a that receives the DBI determination signal DBIDS and eight LSBs and performs an XOR operation to generate eight inversion bits, and an XOR gate 317a that receives the DBI determination signal DBIDS and eight MSBs and performs an XOR operation to generate eight inversion bits. The XOR gate 315a may be referred to as a first XOR gate and the XOR gate 317a may be referred to as a second XOR gate.

Referring to FIG. 14, the XOR gate 315a and the XOR gate 317a may invert the LSB value and the MSB value of the data D0 to change the data D0 from 00 to 11, invert the LSB value and the MSB value of the data D1 to change the data D1 from 00 to 11, invert the LSB value and the MSB value of the data D2 to change the data D2 from 00 to 11, and invert the LSB value and the MSB value of the data D3 to change the data D3 from 00 to 11.

In addition, the XOR gate 315a and the XOR gate 317a may invert the LSB value and the MSB value of the data D4 to change the data D4 from 00 to 11, invert the LSB value and the MSB value of the data D5 to change the data D5 from 01 to 10, invert the LSB value and the MSB value of the data D6 to change the data D6 from 10 to 01, and invert the LSB value and the MSB value of the data D7 to change the data D7 from 11 to 00.

Since the DBI signal DBI having a value of 0 is transmitted together through the DBI port, the receiving device (e.g., the memory controller 10 of FIG. 1) may invert the LSB and MSB of the received data signal DQ to restore data.

As can be seen in FIG. 14, before DBI is performed, the number of data of which the value of MSB and the value of LSB are 00 among the eight data D0 to D7 to be transmitted in the unit interval UI was five (e.g., D0 through D4), but it can be seen that it has reduced to one (e.g., D7) through performing DBI. Accordingly, the amount of current consumed in the data transmission process may be reduced, thereby improving power consumption characteristics of the data channel.

FIG. 15 is a diagram illustrating a case where data different from the data illustrated in FIG. 12 is provided to an encoder.

Referring to FIGS. 9 and 15, the bit separator 311 may receive the illustrated 16 bits and separate the MSB and LSB of each data. For example, in the data D0, the MSB is 0 and the LSB is 0, in the data D1, the MSB is 0 and the LSB is 0, in the data D2, the MSB is 0 and the LSB is 0, and in the data D3, the MSB is 1 and the LSB is 1. In the data D4, the MSB is 1 and the LSB is 1, in the data D5, the MSB is 0 and the LSB is 1, in the data D6, the MSB is 1 and the LSB is 0, and in the data D7, the MSB is 1 and the LSB is 1.

When a NOR operation is performed on the eight MSBs and eight LSBs illustrated, the operation result is 1 for the data of which the value of MSB and the value of LSB are 00, and the operation result is 0 for the other data.

In the example illustrated in FIG. 15, since the number of ones is 3, the counter 313a may output 1. In this case, the data D0 to D7 may be transmitted without DBI.

In the example illustrated in FIG. 15, since the output of the counter 313a is 1, the value of the DBI determination signal DBIDS is 0. In this case, there is no need to perform DBI.

In the example illustrated in FIG. 15, since the value of the DBI determination signal DBIDS is 0, the inverter 314 outputs the DBI signal DBI having a value of 1. In this case, the receiving device (for example, the memory controller 10 of FIG. 1) does not perform a separate DBI restoration operation on the data signal DQ.

In addition, since the value of the DBI determination signal DBIDS is 0, the XOR gate 315a and the XOR gate 317a do not generate inversion bits for LSB and MSB, respectively. Accordingly, the data D0 to D7 may be provided to the data transmission unit 316 without changing the values of MSB and LSB, and the data transmission unit 316 may determine the data signal levels DSL1 to DSL4 of FIG. 7 of each data D0 to D7 based on the values of MSB and LSB of each data D0 to D7 and may transmit each data D0 to D7 as the data signal DQ.

Figure 16:
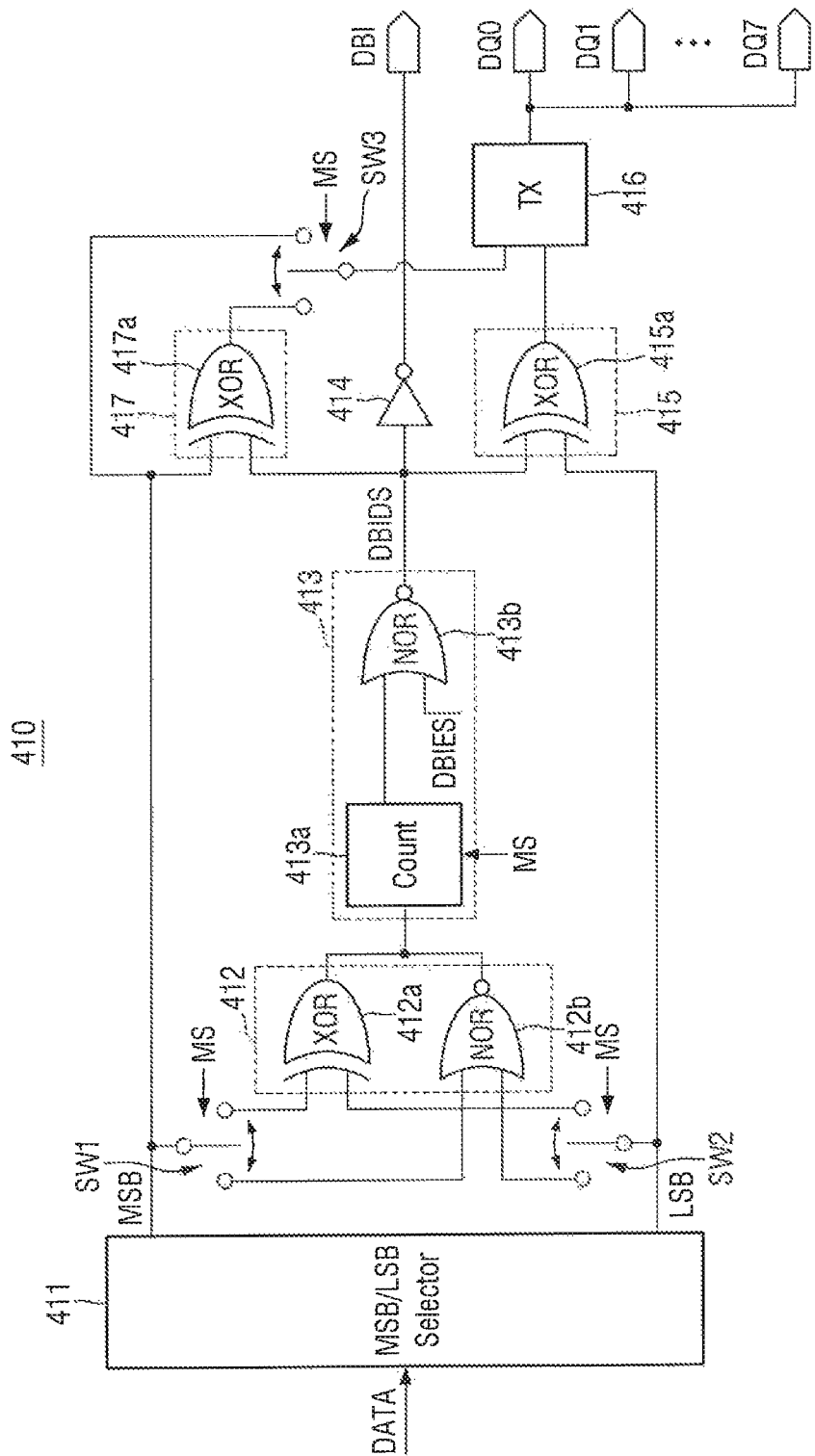
FIG. 16 is a block diagram of an encoder according to some embodiments of the present disclosure.

FIG. 16 is a block diagram of an encoder according to some embodiments of the present disclosure.

The following description of FIG. 16 is mainly directed to differences from the above-described embodiment of FIG. 9.

Referring to FIG. 16, an encoder 410 may include a bit separator 411, a logic calculator 412, a DBI determiner 413, an inverter 414, inversion units 415 and 417, and a data transmission unit 416.

The configuration and function of the bit separator 411, the inversion unit 415, and the data transmission unit 416 are similar to those of the above-described embodiments, and thus a redundant description will be omitted.

The logic operator 412 may include an XOR gate 412a and a NOR gate 412b. Any one of the XOR gate 412a and the NOR gate 412b may be activated by switches SW1 and SW2 controlled by a mode signal MS.

The DBI determiner 413 may include a counter 413a and a NOR gate 413b.

The encoder 410 may perform the operations described above by means of the switches SW1, SW2, and SW3 controlled according to the mode signal and the counter 413a. The switches SW1, SW2, and SW3 may be referred to as first, second and third switches.

For example, in a case of a high speed mode or a performance priority mode, the switches SW1 and SW2 may connect the bit separator 411 to the XOR gate 412a. In addition, the counter 413a may count the number of 0s among the XOR results of the XOR gate 412a. In addition, the switch SW3 may form a path so that the MSB that has not been inverted is provided to the data transmission unit 416. Accordingly, the encoder 410 may perform the operation described above with reference to FIGS. 3 to 8.

Conversely, for example, in a case of a low speed mode or a power saving mode, the switches SW1 and SW2 may connect the bit separator 411 to the NOR gate 412*b*. In addition, the counter 413*a* may count the number of one among the NOR results of the NOR gate 412*b*. In addition, the switch SW3 may connect an XOR gate 417*a* to the data transmission unit 416. Accordingly, the encoder 410 may perform the operation described above with reference to FIGS. 9 to 15.

In concluding the detailed description, those skilled in the art will appreciate that many variations and modifications may be made to the disclosed embodiments without departing from the scope of the present disclosure. Therefore, present disclosure should not be limited by the disclosed embodiments.

What is claimed is:

1. A data transmission method for transmitting a data signal using four data signal levels during a unit interval and transmitting a data bus inversion (DBI) signal using two DBI signal levels during the unit interval, the method comprising:
  receiving n (n is a natural number) data, each of the n data including a first bit and a second bit;
  counting the number of data in which the first bit and the second bit have the same value among the n data;
  in response to the counting result being less than or equal to a predetermined number, transmitting the n data using the four data signal levels, together with a DBI signal having a first DBI signal level; and
  in response to the counting result being greater than the predetermined number, transmitting data, which is obtained by changing a value of either of the first bit and the second bit of the n data, using the four data signal levels, together with a DBI signal having a second DBI signal level different from the first DBI signal level.

2. The data transmission method of claim 1, wherein the first bit includes a most significant bit (MSB), and the second bit includes a least significant bit (LSB).

3. The data transmission method of claim 2, wherein the changing of the value of either of the first bit and the second bit of the n data comprises changing a value of the LSB of the n data.

4. The data transmission method of claim 3, wherein the changing of the value of the LSB of the n data comprises inverting the value of the LSB of the n data.

5. The data transmission method of claim 4, wherein the inverting of the value of the LSB of the n data comprises inverting the value of the LSB of the n data using an XOR operation.

6. The data transmission method of claim 1, wherein the receiving of the n data comprises receiving 2n bits.

7. The data transmission method of claim 1, wherein the counting of the number of data in which the first bit and the second bit have the same value among the n data comprises:
  performing an XOR operation on values of the first bit and the second bit of the n data; and
  counting the number of data in which the first bit and the second bit have the same value among the n data using the XOR operation result.

8. The data transmission method of claim 1, wherein the n data and the DBI signal are all transmitted during one unit interval.

9. A data transmission device, comprising:
  a logic operator configured to perform a logic operation on n (n is a natural number) first bits and n second bits to output n logic operation results;
  a data bus inversion (DBI) determiner configured to generate a DBI determination signal by counting the n logic operation results;
  an inversion unit configured to generate n inversion bits by inverting values of the n second bits based on the DBI determination signal;
  a data transmission unit configured to receive the n inversion bits and the n first bits and transmit the received n inversion bits and n first bits as a data signal; and
  a DBI transmitter configured to generate and transmit a DBI signal based on the DBI determination signal,
  wherein the n inversion bits include a first inversion bit, the n first bits include a third bit,
  the n first bits and the n second bits include first data,
  the data transmission unit transmits the data signal by selecting one of four data signal levels based on the first inversion bit and the third bit, and
  the DBI transmitter transmits the DBI signal by selecting one of two DBI signal levels based on the DBI determination signal.

10. The data transmission device of claim 9, wherein the logic operator includes an XOR gate configured to perform an XOR operation on the n first bits and the n second bits to output n XOR results.

11. The data transmission device of claim 10, wherein the DBI determiner includes a counter configured to count the number of zeros among the n XOR results.

12. The data transmission device of claim 11, wherein the DBI determiner further includes a NOR gate configured to receive a DBI enable signal and an output of the counter and perform a NOR operation to generate the DBI determination signal.

13. The data transmission device of claim 12, wherein the inversion unit includes an XOR gate configured to receive the DBI determination signal and the n second bits and perform an XOR operation to generate the n inversion bits.

14. The data transmission device of claim 13, wherein the DBI transmitter includes an inverter configured to invert and output the DBI determination signal.

15. The data transmission device of claim 9, wherein the logic operator includes a NOR gate configured to perform a NOR operation on the n first bits and the n second bits to output n NOR results.

16. The data transmission device of claim 15, wherein the DBI determiner includes:
  a counter configured to count the number of ones among the n NOR results; and
  a NOR gate configured to receive a DBI enable signal and an output of the counter and perform a NOR operation to generate the DBI determination signal.

17. The data transmission device of claim 16, wherein the inversion unit includes:
  a first XOR gate configured to receive the DBI determination signal and the n first bits and perform an XOR operation to generate the n first inversion bits; and
  a second XOR gate configured to receive the DBI determination signal and the n second bits and perform an XOR operation to generate the n second inversion bits,
  wherein the data transmission unit receives the n first inversion bits and the n second inversion bits and transmits the received n first inversion bits and n second inversion bits as the data signal.

18. A data transmission method for transmitting a data signal using four data signal levels during a unit interval and transmitting a data bus inversion (DBI) signal using two DBI signal levels during the unit interval, the method comprising:

receiving n (n is a natural number) data, each of the n data including a first bit and a second bit;

counting the number of data in which the first bit and the second bit have a predetermined value among the n data;

in response to the counting result being less than or equal to a predetermined number, transmitting the n data using the four data signal levels, together with a DBI signal having a first DBI signal level; and in response to the counting result being greater than the predetermined number, transmitting data, which is obtained by changing values of the first bit and the second bit of the n data, using the four data signal levels, together with a DBI signal having a second DBI signal level different from the first DBI signal level.

19. The data transmission method of claim 18, wherein the first bit includes a most significant bit (MSB), the second bit includes a least significant bit (LSB), and the changing of values of the first bit and the second bit of the n data comprises inverting values of the MSB and the LSB of the n data.

20. The data transmission method of claim 18, wherein the counting of the number of data in which the first bit and the second bit have a predetermined value among the n data comprises:

performing a NOR operation on values of the first bit and the second bit of the n data; and counting the number of data in which the first bit and the second bit have the predetermined value among the n data using the NOR operation result.

* * * * *